US006377637B1

(12) United States Patent
Berdugo

(10) Patent No.: US 6,377,637 B1
(45) Date of Patent: Apr. 23, 2002

(54) SUB-BAND EXPONENTIAL SMOOTHING NOISE CANCELING SYSTEM

(75) Inventor: Baruch Berdugo, Kiriat-Ata (IL)

(73) Assignee: Andrea Electronics Corporation, Melville, NY (US)

(*) Notice: Subject to any disclaimer, the term of this patent is extended or adjusted under 35 U.S.C. 154(b) by 0 days.

(21) Appl. No.: 09/614,875

(22) Filed: Jul. 12, 2000

(51) Int. Cl.[7] .......................... H03D 1/04; H03D 1/06; H03K 5/01; H03K 6/04; H04L 1/00

(52) U.S. Cl. ..................... 375/346; 375/285; 381/94.1; 381/71.1; 379/406.01

(58) Field of Search ................................ 375/285, 296, 375/346, 349; 381/94.1, 71.1; 379/406.01, 406.06, 406.08, 406.12, 406.13, 406.14

(56) References Cited

U.S. PATENT DOCUMENTS 4,896,356 A * 1/1990 Millar ....................... 381/94.7
4,965,834 A * 10/1990 Miller ........................ 704/205
5,517,435 A * 5/1996 Sugiyama ................... 708/322
5,627,799 A * 5/1997 Hoshuyama ................ 367/121
5,825,898 A * 10/1998 Marash ........................ 381/92
5,890,125 A * 3/1999 Davis et al. ................ 704/501
5,937,009 A * 8/1999 Wong et al. ................ 375/286
6,049,607 A * 4/2000 Marash et al. ......... 379/406.08
6,104,822 A * 8/2000 Melanson et al. .......... 381/320

* cited by examiner

*Primary Examiner*—Stephen Chin
*Assistant Examiner*—Lenny Jiang
(74) *Attorney, Agent, or Firm*—Frommer Lawrence & Haug LLP; Thomas J. Kowalski

(57) ABSTRACT

A noise canceling method and apparatus for canceling noise by time domain processing sub-bands of a digital input signal. The input signal is divided into a number of frequency-limited time-domain sub-bands. Each sub-band is then individually processed to cancel noise present in the signal. The noise processing includes exponential averaging of the input, noise estimation, and subtraction processing. The noise subtraction process is simplified by generating a filter coefficient that is exponentially smoothed, hard limited, and multiplied with the input signal to generate the noise processed output for each sub-band. The noise processed bands are then recombined into a digital output signal. Implementation may be effected in software or hardware and applied to various noise canceling and signal processing applications.

14 Claims, 6 Drawing Sheets

Sub-band Noise Canceling System

Sub-band Noise Canceling System

SUB-BAND EXPONENTIAL SMOOTHING NOISE CANCELING SYSTEM

RELATED APPLICATIONS

The following applications and patent(s) are cited and are hereby incorporated by reference: U.S. patent application Ser. No. 09/252,874 filed Feb. 18, 1999, U.S. patent application Ser. No. 09/157,035 now issued U.S. Pat. No. 6,049, 607 issued Apr. 11, 2000, U.S. patent application Ser. No. 09/055,709 filed Apr. 7, 1998, U.S. patent application Ser. No. 09/130,923 filed Aug. 6, 1998, U.S. patent application Ser. No. 08/672,899 now issued U.S. Pat. No. 5,825,898 issued Oct. 20, 1998, and International Application No. PCT/U.S.99/21186. And, all documents cited herein are incorporated herein by reference, as are documents cited or referenced in documents cited herein.

FIELD OF THE INVENTION

The present invention relates to noise cancellation and reduction and, more specifically, to noise cancellation and reduction using sub-band processing and exponential smoothing.

BACKGROUND OF THE INVENTION

Ambient noise added to speech degrades the performance of speech processing algorithms. Such processing algorithms may include dictation, voice activation, voice compression and other systems. The ambient noise also degrades the sound and voice quality and intelligibility. In such systems, it is desired to reduce the noise and improve the signal to noise ratio (S/N ratio) without effecting the speech and its characteristics.

Near field noise canceling microphones provide a satisfactory solution but require that the microphone be in proximity with the voice source (e.g., mouth). In many cases, this is achieved by mounting the microphone on a boom of a headset which situates the microphone at the end of a boom near the mouth of the wearer. However, headsets have proven to be either uncomfortable to wear or too restricting for operation in, for example, an automobile.

Microphone array technology in general, and adaptive beamforming arrays in particular, handle severe directional noises in the most efficient way. These systems map the noise field and create nulls towards the noise sources. The number of nulls is limited by the number of microphone elements and processing power. Such arrays have the benefit of hands-free operation without the necessity of a headset.

However, when the noise sources are diffused, the performance of the adaptive system will be reduced to the performance of a regular delay and sum microphone array, which is not always satisfactory. This is the case where the environment is quite reverberant, such as when the noises are strongly reflected from the walls of a room and reach the array from an infinite number of directions. Such is also the case in a car environment for some of the noises radiated from the car chassis. Another downside to the array solution is that it requires multiple microphones which has an impact on the physical size of the solution and the price. It also eliminates the capability to provide a noise reduction capability to existing systems that already have one microphone implemented and that can not add additional microphones.

One proposed solution to futher reduce the noise is the spectral subtraction technique that estimates the noise magnitude spectrum of the polluted signal by measuring it during non-speech time intervals detected by a voice switch, and then subtracting the noise magnitude spectrum from the signal. This method, described in detail in Suppression of Acoustic Noise in Speech Using Spectral Subtraction, (Steven F Boll, IEEE ASSP-27 NO.2 Apr. 1979), achieves good results for stationary diffused noises that are not correlated with the speech signal. The spectral subtraction method, however, creates artifacts, sometimes described as musical noise, that may reduce the performance of the speech algorithm (such as voice recording or voice activation) if the spectral subtraction is uncontrolled.

Another problem is that the magnitude calculation of the FFT result is quite complex. This involves square and square root calculations which are very expensive in terms of computation load. Yet another problem is the association of the phase information to the noise free magnitude spectrum in order to obtain the information for the IFFT. This process requires the calculation of the phase, the storage of the information, and applying the information to the magnitude data—all are expensive in terms of computation and memory requirements. Shortening the length of the FFT results in a wider bandwidth of each bin and better stability but reduces the performance of the system. Averaging-over-time, moreover, smears the data and, for this reason, cannot be extended to more than a few frames.

An improved spectral subtraction technique has been proposed in U.S. patent Ser. No. 09/252,874, filed Feb. 18, 1999. The improved system has a threshold detector that precisely detects the positions of the noise elements, even within continuous speech segments, by determining whether frequency spectrum elements, or bins, of the input signal are within a threshold set according to a minimum value of the frequency spectrum elements over a preset period of time. More precisely, current and future minimum values of the frequency spectrum elements. Thus, for each syllable, the energy of the noise elements is determined by a separate threshold determination without examination of the overall signal energy, thereby providing good and stable estimation of the noise. In addition, the system preferably sets the threshold continuously and resets the threshold within a predetermined period of time of, for example, five seconds.

In order to reduce instability of the spectral estimation, the improved spectral subtraction technique performs a two-dimensional (2D) smoothing process and is applied to the signal estimation. A two-step smoothing function using first neighboring frequency bins in each time frame then applying an exponential time average effecting an average over time for each frequency bin produces excellent results.

In order to reduce the complexity of determining the phase of the frequency bins during subtraction to thereby align the phases of the subtracting elements, the improved technique applies a filter multiplication to effect the subtraction. The filter function, a Weiner filter function for example, or an approximation of the Weiner filter is multiplied by the complex data of the frequency domain audio signal.

However, these spectral subtraction techniques still require complex and computationally intense FFT calculations in order to operate on the data while in the frequency domain. Adding to the computation time is a latency that results while waiting for sufficient data points/samples to buffer prior to performing the calculations. This latency problem results in an overall system delay that can cause difficulties in real-time applications. Also the 2D smoothing process reduces the artifacts (also known as musical noise) but these would still be audible, especially when voice is not present. In quiet sections this residual noise sounds artificial in nature and can be annoying to listen to.

OBJECTS AND SUMMARY OF THE INVENTION

It is therefore an object of this invention to provide a sub-band time domain noise canceling system that has a simple, yet efficient mechanism, to estimate and subtract noise even in poor signal-to-noise ratio situations and in continuous fast speech cases.

It is another object of this invention to provide an efficient mechanism that improves the processing throughput by reducing the latency problem in related art systems.

It is yet another object of this invention to provide an efficient mechanism that removes the residual (musical) noise problem in related art systems.

In accordance with the foregoing objectives, the present invention provides a system that correctly determines the non-speech segments of the audio signal thereby preventing erroneous processing of the noise canceling signal during the speech segments.

To attain the above objectives, the present invention provides an input for inputting a digital signal that includes a noise signal component; a band splitter for dividing the digital input signal into a number of frequency-limited time-domain signal sub-bands; a number of noise processors which correspond to each of the sub-bands such that the noise signal components in the digital input signal are canceled; and a recombiner for recombining the noise processed sub-bands into a digital output signal.

A particular aspect of the present invention is that the input beam is split into a number of frequency-limited sub-bands, preferably 16 evenly spaced bands, by the band splitter such that noise processing is performed on each frequency band separately. By splitting the bands into, for example, 16 channels the present invention reduces the sampling rate needed to be processed by the noise processors. It will be appreciated that, not only is this system much more manageable, the noise processors can be optimized for each frequency separately by, for example, adjusting various thresholding parameters corresponding to expected noise levels within a given band. The band splitter is, for example, a DFT filter bank that uses single side band modulation to divide the digital input signal.

Each noise processor is made up of an exponential averager, a noise estimator, and a subtraction processor. The exponential averager computes a rolling average input value on the basis of a weighted average of the previous average value and the current input value. The noise estimator generates a band noise value by performing an exponential smoothing based on a weighted average of the previous noise value and the current input value. If the current input value, providing that the current input is considered to be noise, is greater than a predetermined multiple of a current minimum value the noise estimator does not use the input to determine the new noise estimation. The subtraction processor generates a filter coefficient H on the basis of the rolling average input value and the band noise value, and multiplies the current input value by the filter coefficient to generate a noise canceled value.

Additionally, the subtraction processor may perform a minimum filter coefficient threshold function. If the calculated value is below a certain minimum this certain minimum is replaced with the actual calculated value. This threshold can be used to control the amount of noise reduction. In addition, if the current input is less that a predetermined multiple of the noise threshold value an exponential smoothing of the filter coefficient is performed.

The present invention is applicable to various noise canceling systems including, but not limited to, those systems described in the U.S. patent applications incorporated herein by reference. The present invention, for example, is applicable with cellular phones, personal digital assistants (PDAs), audio applications, automobile acoustics, headphones, and microphone arrays. In addition, the present invention may be embodied as a computer program for driving a computer processor either installed as application software or as hardware.

BRIEF DESCRIPTION OF THE DRAWINGS

A more complete appreciation of the present invention and many of its attendant advantages will be readily obtained by reference to the following detailed description considered in connection with the accompanying drawing, in which.

DETAILED DESCRIPTION

Figure 1:
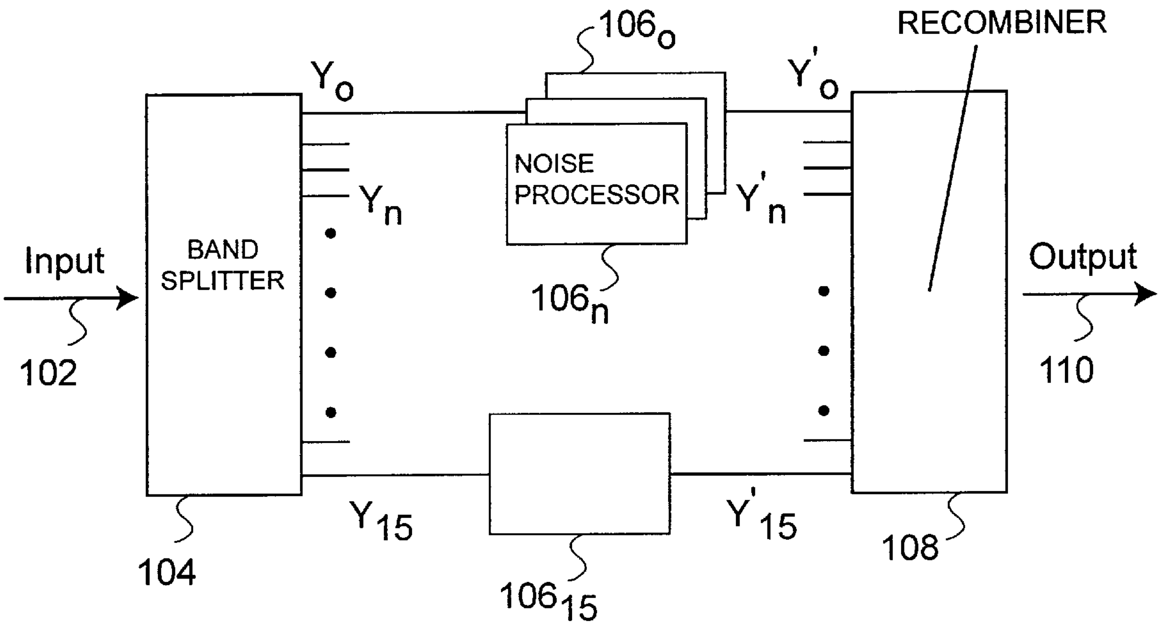
FIG. 1 illustrates the sub-band noise canceling system of the present invention.

FIG. 1 illustrates an embodiment of the present invention 100. The system receives a digital audio signal at input 102 sampled at a frequency which is at least twice the bandwidth of the audio signal. In one embodiment, the signal is derived from a microphone signal that has been processed through an analog front end, A/D converter and a decimation filter to obtain the required sampling frequency. In another embodiment, the input is taken from the output of a beamformer or even an adaptive beamformer. In that case the signal has been processed to eliminate noises arriving from directions other than the desired one leaving mainly noises originated from the same direction of the desired one. In yet another embodiment, the input signal can be obtained from a sound board when the processing is implemented on a PC processor or similar computer processor.

The input signal 102 is then passed through a band splitter 104 that divides the signal into 16 time domain sub-band signals $Y_n$ ($Y_0$–$Y_{15}$). Each sub-band is then processed by a corresponding noise processor $\mathbf{106}_n$ ($\mathbf{106}_0$–$\mathbf{106}_{15}$). The noise processor acts to reduce the noise signal in each sub-band while maintaining the source (voice) signal. The noise processing technique is particularly suited to the occurrence of musical noise. The 16 noise processed sub-bands are then recombined by a recombiner 108. The recombiner 108 outputs a output digital audio signal 110 that corresponds to the input signal 102 only with the noise component significantly reduced.

Figure 2:
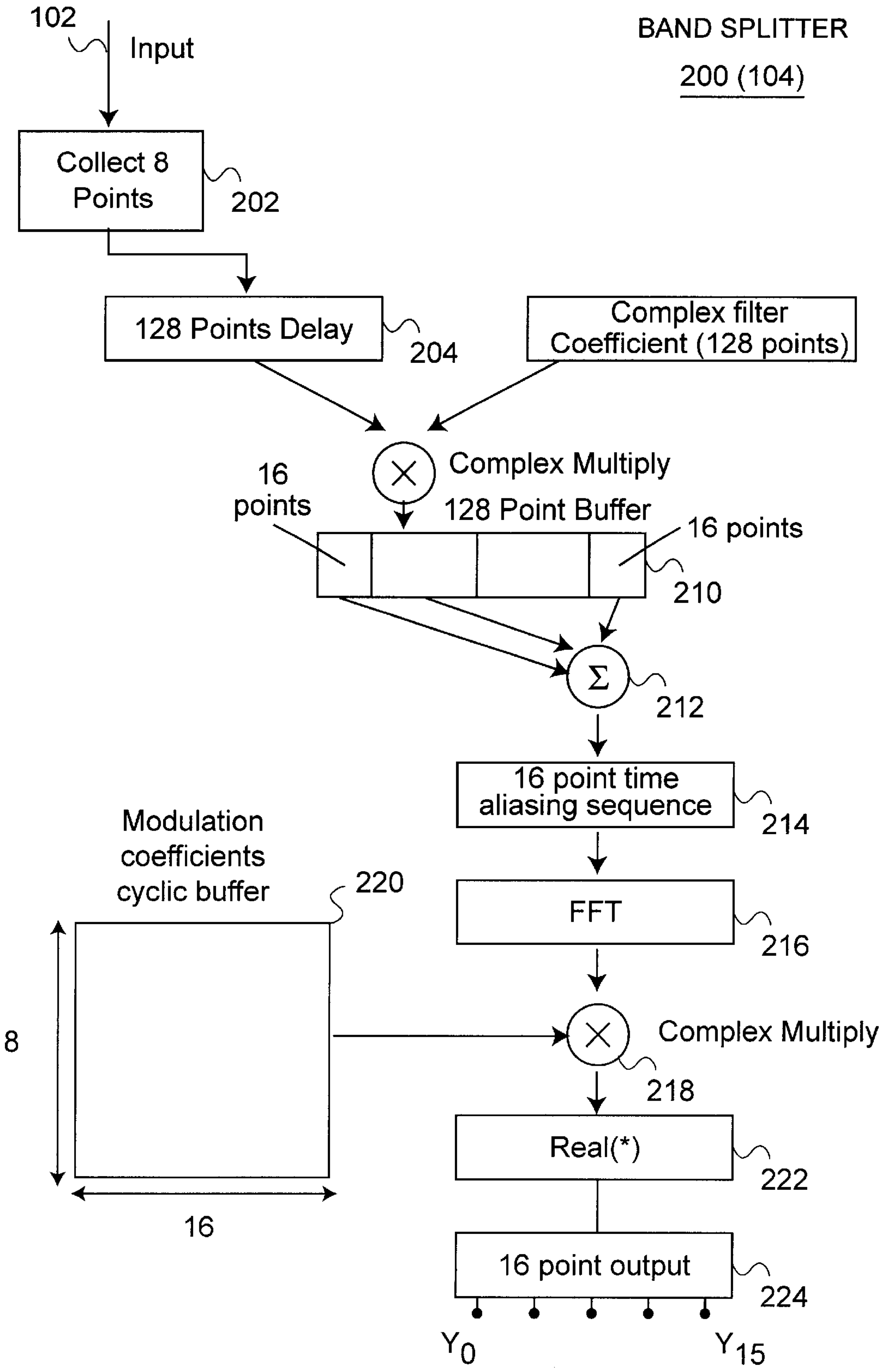
FIG. 2 illustrates the band splitting unit of the present invention.

A particular aspect of the present invention is that the input beam 102 is split into a number of frequency-limited sub-bands by the band splitter 104 such that noise processing is performed on each frequency band separately. FIG. 2 illustrates the band splitter 200 (FIG. 1, Element 104) of the present invention. Although various band splitting techniques may be employed, it is preferred that the generalized DFT filter bank using single side band modulation be employed as described, for example, in "Multirate Digital Signal Processing", Ronald E. Crochiere, Prentice Hall Signal Processing Series or "Multirate Digitals Filters, Filter Banks, Polyphase Networks, and Applications A Tutorial", P. P. Vaidyanathan, Proceedings of the IEEE, Vol. 78, No. 1, Jan. 1990. The goal of the band splitter is to split the input signal into a plurality of limited frequency bands, preferably 16 evenly spaced bands. In essence, the band splitting processes, for example, 8 input points at a time resulting in 16 output points each representing 1 time domain sample per frequency band. Of course, other quantities of samples may be processed depending upon the processing power of the system as will be appreciated by those skilled in the art.

In more detail, the input signal 102 is collected as 8 input points 202 that are stored in a 128 tap delay line 204 representing a 128 point input vector which is multiplied via a multiplier 206 by the coefficients of a 128 point complex coefficient pre-designed filter 208. The 128 complex points result vector is folded by storing the multiplication result in the 128 point buffer 210 and summing the first 16 points with the second 16 points and so on using a summer 212. The folded result, which is referred to as an aliasing sequence 214, is processed through a 16 point Fast Fourier Transform (FFT) 216. The output of the FFT is multiplied via a multiplier 218 by the modulation coefficients of a 16 point modulation coefficient cyclic buffer 220. The cyclic buffer which contains, for example, 8 groups of 16 coefficients, selects a new group each cycle. The real portion of the multiplication result is stored in the real buffer 222 as the requested 16-point output 224. It will be appreciated that, while specific transforms are utilized in the preferred embodiments, it is of course understood that other transforms may be applied to the present invention to obtain the sub-bands.

Figure 3:
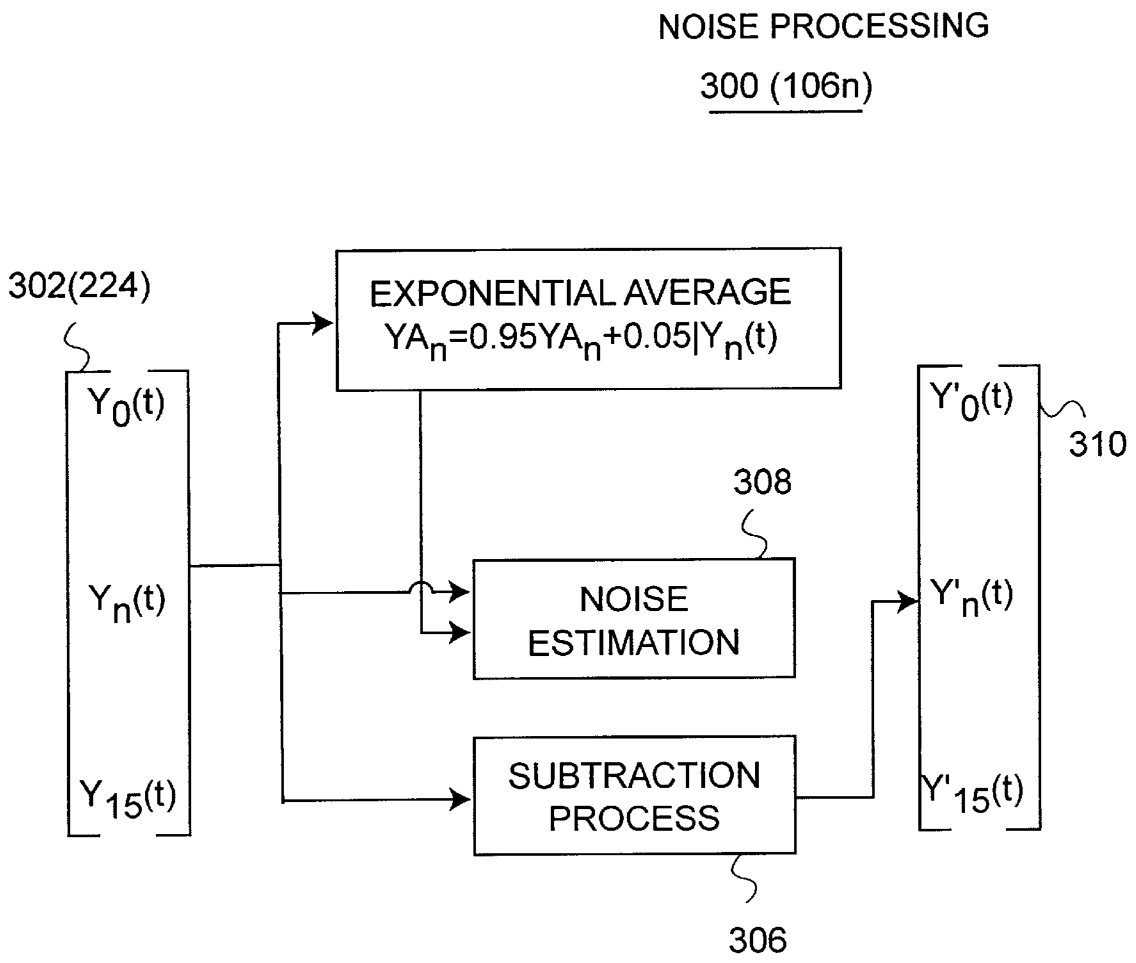
FIG. 3 illustrates the noise processing unit of the present invention.

Each of the frequency limited sub-bands $Y_n$ 302 (224) is processed by a corresponding noise processor 300 ($106_n$). FIG. 3 is a detailed description of one of the noise processors 300. Each noise processor is comprised of an exponential averager 304, a noise estimator 308, and a subtraction processor 306. The sub-band signal is fed to each of these elements for sequential processing. First, the exponential averager 304 generates an average input value $YA_n$, according to Equation 1.

$$YA_n=0.95*YA_n+0.05|Y_n(t)| \quad (1)$$

The time constant for the exponential averaging is typically 0.95 which may be interpreted as taking the average of the last 20 frames. This average input value is then passed to the noise estimator 308, followed by the subtraction processor 306, which are described hereinbelow.

Figure 4:
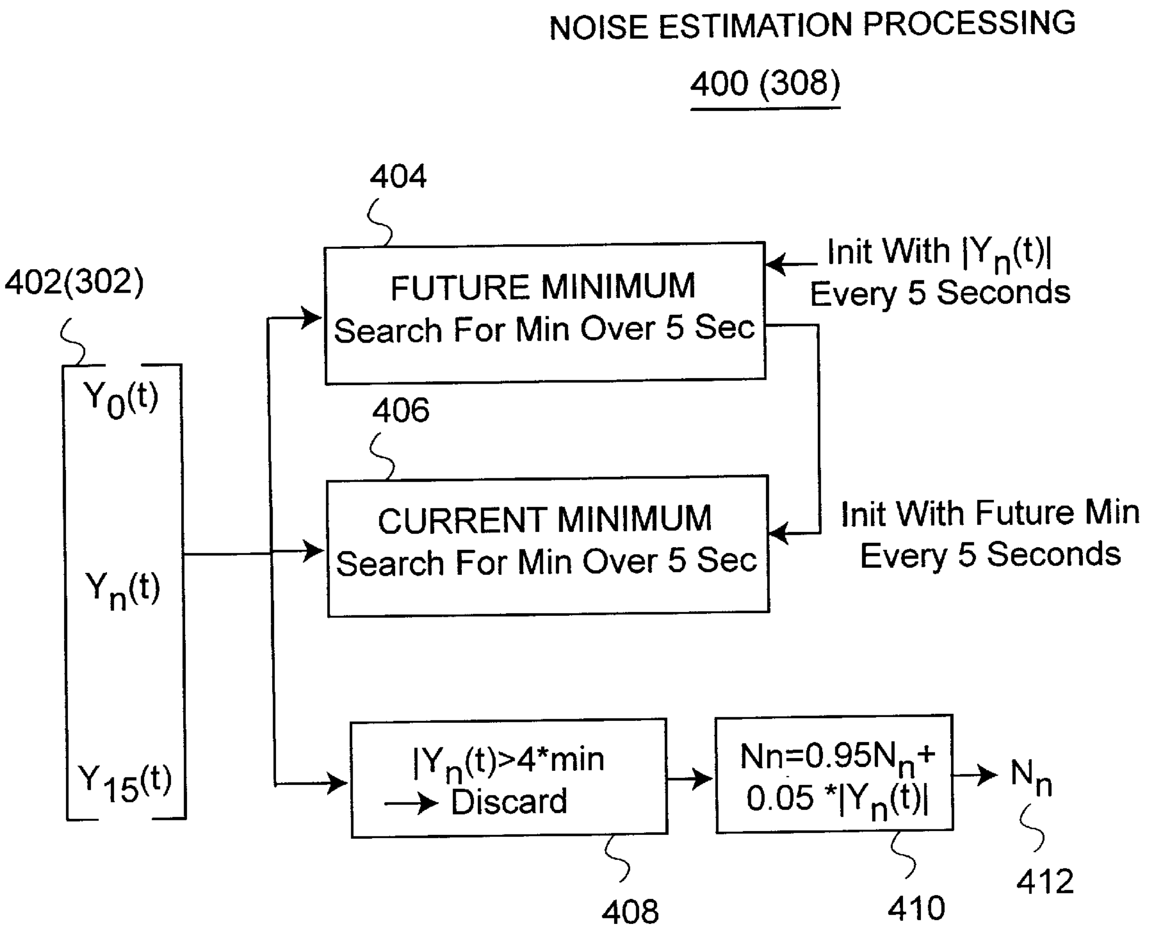
FIG. 4 illustrates the noise estimation process of the present invention.

FIG. 4 is a detailed description of the noise estimator 308. Theoretically, the noise should be estimated by taking a long time average of the signal over non-speech time intervals. This requires that a voice switch be used to detect the speech/non-speech intervals. However, too-sensitive a switch may result in the use of a speech signal for the noise estimation which will degrade the voice signal. On the other hand, a less sensitive switch may dramatically reduce the length of the noise time intervals (especially in continuous speech cases) and impact the validity of the noise estimation.

In the present invention, a separate adaptive threshold is implemented for each sub-band 402. This allows for the noise components in each frequency limited sub-band to be individually processed. It is therefore possible to apply a non-sensitive threshold for the noise and yet locate many non-speech data points for each bin, even within a continuous speech case. The advantage of this method is that it allows the collection of many noise segments for a good and stable estimation of the noise, even within continuous speech segments.

In the threshold determination process, for each sub-band, two minimum values are calculated. A future minimum value is initiated every 5 seconds at 404 with the current value $|Y_n(t)|$ (the absolute value of Y) and is replaced with a smaller minimal value over the next 5 seconds through the following process. The future minimum value of each band is compared with the current value of the signal. If the current value is smaller than the future minimum, the future minimum is replaced with the value which becomes the new future minimum.

At the same time, a current minimum value is calculated at 406. The current minimum is initiated every 5 seconds with the value of the future minimum that was determined over the previous 5 seconds and follows the minimum value of the signal for the next 5 seconds by comparing its value with the current value. The current minimum value is used by the subtraction process, while the future minimum is used for the initiation and refreshing of the current minimum.

The noise estimation mechanism of the present invention ensures a tight and quick estimation of the noise value, with limited memory requirements (5 seconds), while preventing too high an estimation of the noise.

Each sub-band's value $|Y_n(t)|$ is compared with four times the current minimum value of that sub-band by comparator 408—which serves as the adaptive threshold for that sub-band. If the value is within the range (hence below the threshold), it is allowed as noise and used by an exponential averaging unit 410 that determines the level of the noise $N_n$ 412 of that sub-band. If the value is above the threshold the value is discarded (i.e., it is not used in the noise estimation). The time constant for the exponential averaging is typically 0.95 which may be interpreted as taking the average of the last 20 frames. The threshold of 4* minimum value may be changed for some applications.

Figure 5:
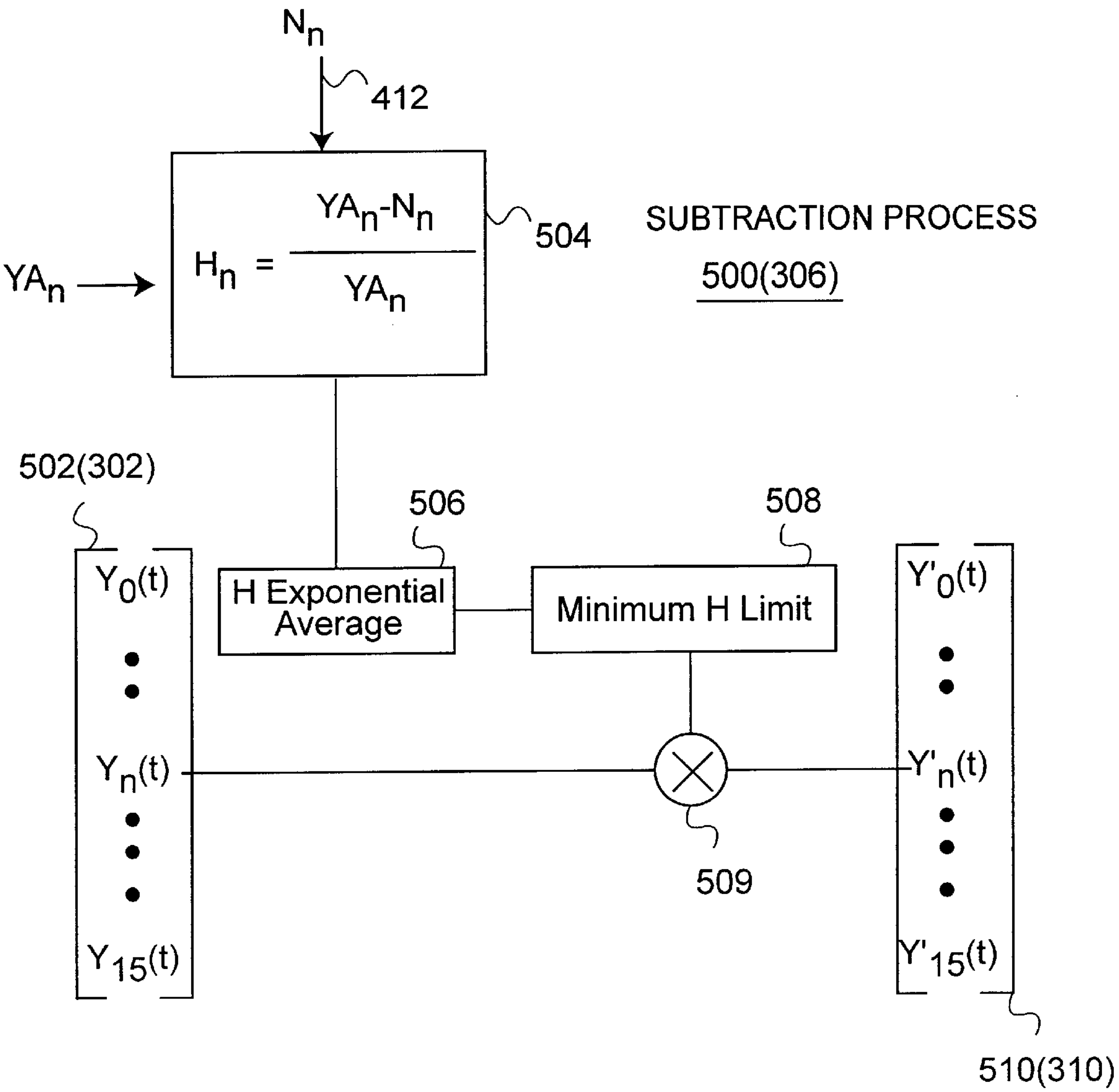
FIG. 5 illustrates the subtraction process of the present invention.

FIG. 5 is a detailed description of the subtraction processor 500 (306). In a straight forward approach, the value of the estimated sub-band noise is subtracted from the current average input value. In this present invention, the subtraction is interpreted as a filter multiplication performed by filter $H_n$ (the filter coefficient). $H_n$ is calculated by filter calculator 504, according to Equation 2.

$$H_n = \frac{YA_n - N_n}{YA_n} \quad (2)$$

Where $YA_n$ is the current average value for sub-band n calculated by the exponential averager 304. $N_n$ is the current estimated noise for sub-band n calculated by the noise estimator 308.

The filter $H_n$ is then processed through adjustment/limiting operations to ensure appropriate filter values are used. These operations are performed by an H exponential averager 506 and a minimum H limiter 508. First, if $YA_n$ is less than twice the estimated noise $N_n$, then the filter is exponentially averaged by the exponential averager 506, according to Equation 3.

$$H_n(t)=0.95*H_n(t-1)+0.05\ H_n(t) \quad (3)$$

This operation smoothes the filter during periods when the signal is not significantly higher than the noise. Such is the case when there is no voice present and the musical noise is most likely to appear and interfere. The smoothing process will eliminate this musical noise. The second operation is a hard limiting threshold, wherein if $H_n$ is less than 0.3, then the minimum H limiter 508 sets $H_n$=0.3. This effectively sets a minimum filter level for when the noise is particularly strong relative to the signal. Both of these operations are improvements designed to enhance filtering performance with reduced artifacts and provide respective advantages over related art processing techniques.

The input sub-bands 502 (302) are then multiplied on a point-by-point basis by the corresponding filter coefficient $H_n$ to generate output noise processed sub-bands 510 (310).

Figure 6:
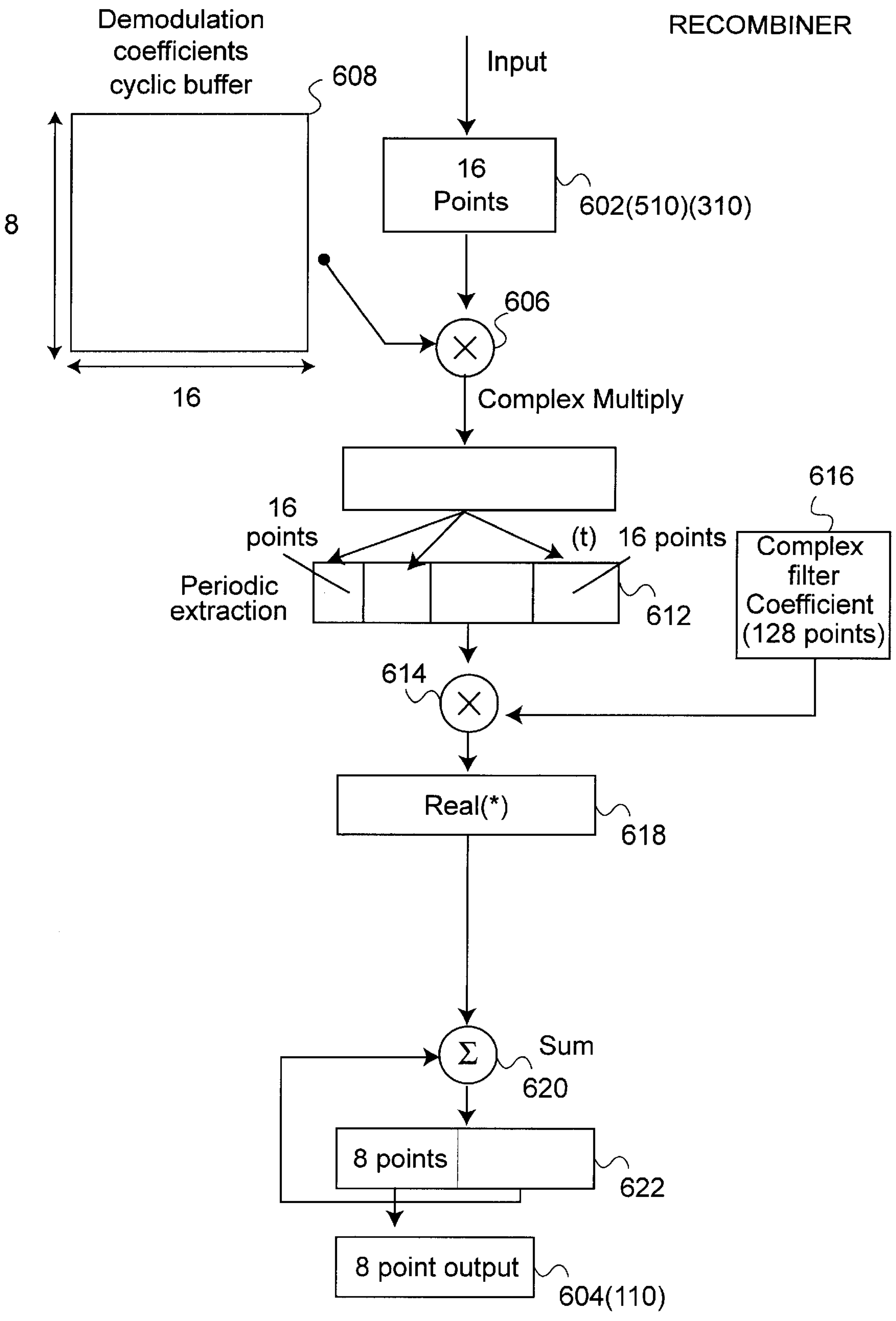
FIG. 6 illustrates the recombining unit of the present invention.

FIG. 6 illustrates the recombiner 600 (FIG. 1, 108) of the present invention which is symmetrical, i.e., opposite, to the sub-band splitting technique described above. The goal here is to recombine the 16 limited frequency bands of the noise processed signal into one broad band output. The process goes through an Inverse Fast Fourier Transform (IFFT) process but both the input and output are time domain signals. The recombining unit of the exemplary embodiment processes 16 input points 602 (510, 310) each representing 1 time domain sample per frequency band resulting in 8 output points 604 of the broadband signal. Of course, those skilled in the art will readily understand that other quantities of sampling input points are applicable to the present invention.

In more detail, the new 16 input points 602 are multiplied by a multiplier 606 with a 16 point demodulation filter coefficient which is stored in a demodulation coefficient cyclic buffer 608 containing, for example, 8 groups of 16 coefficients wherein a new group is selected each cycle. The result is processed through a 16 point IFFT 610, or any equivalent transform, and the result of this IFFT is extracted to 128 complex points by duplicating the 16 point data 8 times. The 128 point result vector which is stored in a buffer 612 is multiplied via the multiplier 614 by a 128 point complex coefficient generated by a predesigned complex filter 616 and stored in real buffer 618. The real portion of the result is summed by summer 620 into a 128 point cyclic history buffer 622 in which the oldest 8 points are taken as the result 604 and replaced with zeros in the buffer 622 for the next iteration of the recombination process.

It will be appreciated that the present invention processes input data on a continuous basis in groups of as few as 8 data points 202. This provides a throughput advantage over related art systems that process in the frequency domain and must wait until sufficient data points, for example 1024, are accumulated before performing FFT processing. Therefore, the present invention eliminates much of the latency that is inherent in other related art systems.

With the present invention, a sub-band noise subtraction system is provided that has a simple, yet efficient mechanism, to estimate the noise even in poor signal to noise ratio situations and in continuous fast speech cases. An efficient mechanism is provided that can perform the magnitude estimation with little cost, and will overcome the problem of processing latency. A stable mechanism is provided to estimate the noise and prevent the creation of musical noise.

The noise processing technique of the present invention can be utilized in conjunction with the array techniques, close talk microphone technique or as a stand alone system. The noise subtraction of the present invention can be implemented in embedded hardware (DSP) as a stand alone system, as part of other embedded algorithms such as adaptive beamforming, or as a firmware application running on a PC using data obtained from a sound port.

It will be appreciated that the present invention may also be practiced as a software application, preferably written using C or any other programming language, which may be embedded on, for example, a programmable memory chip or stored on a computer-readable medium such as, for example, an optical disk, and retrieved therefrom to drive a computer processor.

It will be appreciated that, while specific values are used as in the several equations and calculations employed in the present invention, these values may be different than those shown.

Although preferred embodiments of the present invention and modifications thereof have been described in detail herein, it is to be understood that this invention is not limited to those precise embodiments and modifications, and that other modifications and variations may be affected by one skilled in the art without departing from the spirit and scope of the invention as defined by the appended claims.

What is claimed is:

1. An apparatus for canceling noise by time domain processing sub-bands of a digital input signal, comprising:

input means for inputting a digital input signal which includes a noise signal;

band splitting means for dividing said digital input signal into a plurality of frequency-limited time-domain signal sub-bands by using single side band modulation and a DFT filter bank;

a plurality of noise processing means each for processing a corresponding one of said plurality of signal sub-bands such that said noise signal included in said digital input signal is cancelled; wherein each noise processing means is further comprised of exponential averaging means, noise estimating means, and subtraction processing means; and recombining means for recombining the noise processed plurality of signal sub-bands into a digital output signal.

2. The apparatus according to claim 1, wherein said exponential averaging means computes a rolling average input value on the basis of a weighted average of the previous value of said rolling average input value and a current input value.

3. The apparatus according to claim 1, wherein said noise estimation means generates a band noise value by performing an exponential smoothing based on a weighted average of the previous value of said band noise value and a current input value.

4. The apparatus according to claim 3, wherein if the current input value is greater than a predetermined multiple of a current minimum value the current input value is not considered to be noise and said noise estimator is not updated.

5. The apparatus according to claim 1, wherein said subtraction processing means generates a filter coefficient H on the basis of a rolling average input value and a band noise value, and multiplies a current input value by said filter coefficient to generate a noise canceled value.

6. The apparatus according to claim 5, wherein said subtraction processing means further performs a minimum filter coefficient threshold function.

7. The apparatus according to claim 5, wherein if the current input value is less than a predetermined noise threshold value said subtraction processing means further performs an exponential smoothing of said filter coefficient.

8. A method for canceling noise by time domain processing sub-bands of a digital input signal, comprising the steps of:

inputting a digital input signal which includes a noise signal;

dividing said digital input signal into a plurality of sub-bands by using single side band modulation and a DFT filter bank;

noise processing a corresponding one of said plurality of sub-bands such that said noise signal included in said digital input signal is canceled; said noise processing step further comprising the steps of exponential averaging, noise estimating, and subtraction processing; and recombining the noise processed plurality of sub-bands into a digital output signal using a recombining means.

9. The method according to claim 8, wherein said exponential averaging step computes a rolling average input value on the basis of a weighted average of the previous value of said rolling average input value and a current input value.

10. The method according to claim 8, wherein said noise estimating step generates a band noise value by performing an exponential smoothing based on a weighted average of the previous value of said band noise value and a current input value.

11. The method according to claim 10, wherein if the current input value is greater than a predetermined multiple of a current minimum value the current input value is not considered to be noise and said noise estimator is not updated.

12. The method according to claim 8, wherein said subtraction processing step generates a filter coefficient H on the basis of a rolling average input value and a band noise value, and multiplies a current input value by said filter coefficient to generate a noise canceled value.

13. The method according to claim 12, wherein said subtraction processing step further performs a minimum filter coefficient threshold function.

14. The method according to claim 12, wherein if the current input value is less than a predetermined noise threshold value said subtraction processing step further performs an exponential smoothing of said filter coefficient.

* * * * *